(12) United States Patent
Soga

(10) Patent No.: US 11,855,587 B2
(45) Date of Patent: Dec. 26, 2023

(54) POWER AMPLIFIER CIRCUIT

(71) Applicant: Murata Manufacturing Co., Ltd., Kyoto (JP)

(72) Inventor: Takashi Soga, Kyoto (JP)

(73) Assignee: MURATA MANUFACTURING CO., LTD., Kyoto (JP)

(\*) Notice: Subject to any disclaimer, the term of this patent is extended or adjusted under 35 U.S.C. 154(b) by 118 days.

(21) Appl. No.: 16/913,585

(22) Filed: Jun. 26, 2020

(65) Prior Publication Data

US 2020/0412304 A1    Dec. 31, 2020

(30) Foreign Application Priority Data

Jun. 27, 2019  (JP) ................ 2019-119379

(51) Int. Cl.
  *H03F 1/30*  (2006.01)
  *H03F 3/21*  (2006.01)
  *H03F 1/32*  (2006.01)

(52) U.S. Cl.
  CPC .......... *H03F 1/302* (2013.01); *H03F 1/32* (2013.01); *H03F 3/21* (2013.01); *H03F 2200/447* (2013.01); *H03F 2200/451* (2013.01)

(58) Field of Classification Search
  CPC ........................................... H03F 1/30
  USPC ................................................. 330/285, 296
  See application file for complete search history.

(56) References Cited

U.S. PATENT DOCUMENTS

| | | | |
|---|---|---|---|
| 7,400,202 B2* | 7/2008 | Yamamoto | H03F 3/189 330/289 |
| 7,522,001 B2* | 4/2009 | Yamamoto | H03F 1/302 330/285 |
| 10,931,239 B2* | 2/2021 | Chen | H03F 1/0233 |
| 2003/0146790 A1* | 8/2003 | Arell | G05F 3/265 330/296 |
| 2018/0006608 A1 | 1/2018 | Tanaka et al. | |
| 2018/0167035 A1 | 6/2018 | Soga | |

FOREIGN PATENT DOCUMENTS

| | | |
|---|---|---|
| CN | 206775475 U | 12/2017 |
| JP | 2018-98766 A | 6/2018 |

\* cited by examiner

*Primary Examiner* — Henry Choe
(74) *Attorney, Agent, or Firm* — Pearne & Gordon LLP

(57) ABSTRACT

A power amplifier circuit includes an amplifier transistor that amplifies an input signal, a resistance element coupled in series with the base of the amplifier transistor, a bias transistor that supplies a bias current from the emitter or the source of the bias transistor to the base of the amplifier transistor through the resistance element, and a feedback circuit that changes a base or gate voltage of the bias transistor to follow a change in the bias current supplied to the base of the amplifier transistor.

11 Claims, 9 Drawing Sheets

POWER AMPLIFIER CIRCUIT

This application claims priority from Japanese Patent Application No. 2019-119379 filed on Jun. 27, 2019. The content of this application is incorporated herein by reference in its entirety.

BACKGROUND

The present disclosure relates to a power amplifier circuit.

Mobile communication terminals such as mobile phones employ power amplifier circuits for amplifying radio frequency (RF) signals to be transmitted to base stations. The power amplifier circuit includes, for example, a bipolar transistor for amplifying input signals and a bias circuit for determining an operating point for the bipolar transistor. Bipolar transistors have the thermal positive-feedback characteristic in which, when the temperature of the device increases, the collector current increases; this in turn increases the temperature of the device; and the collector current further increases.

With the aim of suppressing such increase in collector current due to temperature rise, for example, Japanese Unexamined Patent Application Publication No. 2018-98766 discloses a power amplifier circuit in which a resistance element (hereinafter also referred to as a ballast resistor) is inserted between the base of a bipolar transistor and a bias circuit. With this configuration, since the rise in base voltage is suppressed due to voltage drop across the ballast resistor, the increase in collector current is accordingly suppressed.

BRIEF SUMMARY

However, when the power of input signal increases, the average value of the bias current supplied from the bias circuit increases along an alternating voltage waveform of the input signal. Due to the increase in the bias current, voltage drop across the ballast resistor excessively increases, and consequently, base voltage of the bipolar transistor falls more than is needed. As a result, the desired operating point of the bipolar transistor is not achieved and the amplitude of collector current does not correspond to the amplitude of base current, and thus, linearity of signal amplification may deteriorate.

The present disclosure provides a power amplifier circuit that can hinder linearity deterioration due to increase in input power.

A power amplifier circuit according to an aspect of the present disclosure includes an amplifier transistor configured to amplify an input signal, a resistance element coupled in series with the base of the amplifier transistor, a bias transistor configured to supply a bias current from the emitter or the source of the bias transistor to the base of the amplifier transistor through the resistance element, and a feedback circuit configured to change a base or gate voltage of the bias transistor to follow a change in the bias current supplied to the base of the amplifier transistor.

The present disclosure can provide a power amplifier circuit that can hinder linearity deterioration due to increase in input power.

Other features, elements, characteristics and advantages of the present disclosure will become more apparent from the following detailed description of embodiments of the present disclosure with reference to the attached drawings.

DETAILED DESCRIPTION

Figure 1:
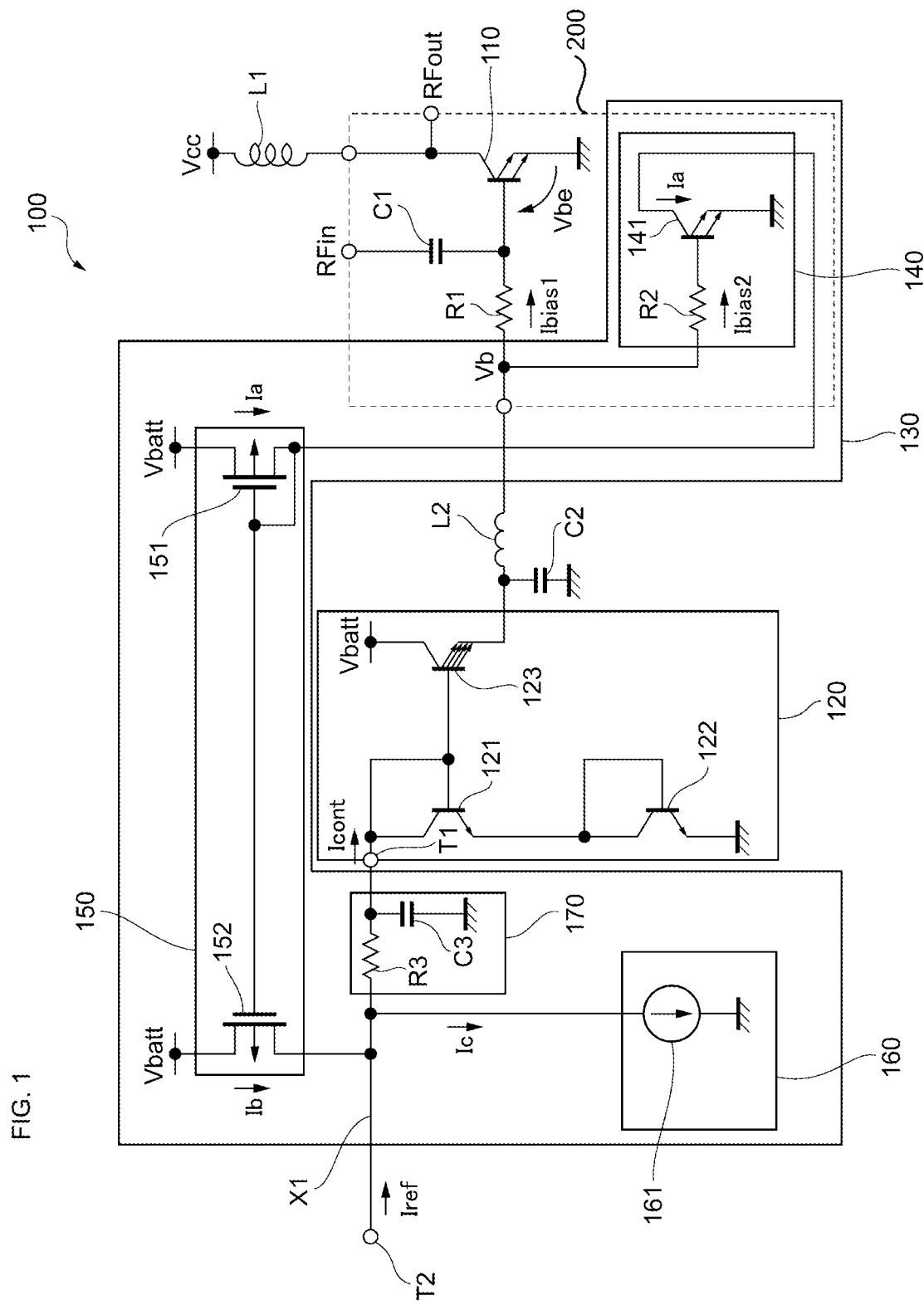
FIG. 1 illustrates an example of a configuration of a power amplifier circuit according to a first embodiment of the present disclosure.

Hereinafter, embodiments of the present disclosure are described in detail with reference to the drawings. It should be noted that the same elements are assigned the same reference characters and redundant descriptions are omitted.

FIG. 1 illustrates an example of a configuration of a power amplifier circuit according to a first embodiment of the present disclosure. A power amplifier circuit 100 according to the present embodiment is provided in, for example, a mobile communication device such as a mobile phone and used for amplifying electric power of radio frequency (RF) signals to be transmitted to base stations. The power amplifier circuit 100 amplifies transmit signals of communication standards such as the second-generation (2G) mobile communication system, the third-generation (3G) mobile communication system, the fourth-generation (4G) mobile communication, the fifth-generation (5G) mobile communication system, Long-Term Evolution Frequency-Division Duplex (LTE-FDD), Long-Term Evolution Time-Division Duplex (LTE-TDD), LTE-Advanced, and LTE-Advanced Pro. The frequency range of the fundamental wave of RF signals is, for example, from approximately several hundreds of MHz to several tens of GHz. The communication standard and the frequency of signals amplified by the power amplifier circuit 100 are not limited to these examples.

As illustrated in FIG. 1, the power amplifier circuit 100 includes, for example, a transistor 110, a bias circuit 120, a feedback circuit 130, capacitors C1 and C2, inductors L1 and L2, and a resistance element R1.

The transistor 110 (an amplifier transistor) amplifies an RF signal RFin (an input signal) and outputs an RF signal RFout. The transistor 110 is configured by using a bipolar transistor such as a heterojunction bipolar transistor (HBT).

As for the transistor 110, a power supply voltage Vcc is supplied to the collector through the inductor L1; an RF signal RFin is inputted to the base through the capacitor C1; and the emitter is grounded. A bias current is supplied to the base of the transistor 110 from the bias circuit 120 through the inductor L2 and the resistance element R1. As a result, the RF signal RFout obtained by amplifying the RF signal RFin is outputted from the collector of the transistor 110.

The bias circuit 120 determines an operating point of the transistor 110 by supplying a bias current or voltage to the base of the transistor 110. The bias circuit 120 adjusts the operating point of the transistor 110 by adjusting the level of the bias current or voltage in accordance with, for example, a control current Icont supplied to an input terminal T1. The control current Icont is a current that flows along a control path X1 connecting a control terminal T2 to the input terminal T1. The control current Icont includes a reference current Iref that is supplied to the control terminal T2. It should be noted that in this specification terminals such as the input terminal T1 and the control terminal T2 are not limited to physical terminals and include particular imaginary points on the path.

The bias circuit 120 includes transistors 121 to 123. In the present embodiment, the transistors 121 to 123 are configured by using, for example, HBTs and formed on a single chip by a bipolar process.

As for the transistor 121, the collector and the base are coupled to each other (hereinafter also referred to as diode connection); the control current Icont is supplied to the collector; and the emitter is coupled to the collector of the transistor 122. The transistor 122 is subjected to diode connection; the collector is coupled to the emitter of the transistor 121; and the emitter is grounded. At the collector of the transistor 121, a voltage (for example, approximately 2.6 V) corresponding to the control current Icont is generated.

As for the transistor 123 (a bias transistor), a battery voltage Vbatt is supplied to the collector; the base is coupled to the collector of the transistor 121; and the emitter is coupled to the base of the transistor 110 via the inductor L2 and the resistance element R1. The base voltage of the transistor 123 changes in accordance with the control current Icont supplied to the transistor 121.

With the configuration described above, the bias circuit 120 supplies a bias current Ibias1 corresponding to the base voltage of the transistor 123, that is, the collector voltage of the transistor 121, from the emitter of the transistor 123 to the base of the transistor 110. Furthermore, the bias circuit 120 determines the operating point of the transistor 110 by supplying a bias voltage Vb from the emitter of the transistor 123 to the base of the transistor 110. The bias voltage Vb is a voltage at one end of the resistance element R1 on the bias circuit 120 side. The control current Icont will be described in detail later.

As for the capacitor C1, the RF signal RFin is inputted to one end; and the other end is coupled to the base of the transistor 110. The capacitor C1 blocks a direct current component of RF signal and passes an alternating current component.

As for the inductor L1, the power supply voltage Vcc is supplied to one end; and the other end is coupled to the collector of the transistor 110. The inductor L1 hinders transmission of RF signals to a power supply circuit (not illustrated in the drawing) side.

As for the capacitor C2, one end is coupled to the emitter of the transistor 123 and the other end is grounded. The inductor L2 is coupled in series between the emitter of the transistor 123 and the resistance element R1. The capacitor C2 and the inductor L2 both have a function of filter circuit of hindering transmission of RF signals to the bias circuit 120 side. The power amplifier circuit 100 may exclude at least either the capacitor C2 or the inductor L2.

As for the resistance element R1, one end is coupled to an output terminal of the bias circuit 120, that is, the emitter of the transistor 123, via the inductor L2; and the other end is coupled to the base of the transistor 110. The resistance element R1 is a ballast resistor coupled in series with the base of the transistor 110. This means that the transistor 110 has the thermal positive-feedback characteristic in which, when the temperature of the device increases, the collector current increases; this in turn increases the temperature of the device; and the collector current further increases. Providing a ballast resistor for the base of the transistor 110 causes voltage drop determined as the product of the resistance of the ballast resistor and the base current of the transistor 110. As the base current of the transistor 110 increases, voltage drop across the ballast resistor increases and the bias voltage of the transistor 110 thus decreases, and as a result, increase in the collector current is hindered.

However, when the power of the RF signal RFin increases close to, for example, the maximum output, the average value of the bias current Ibias1 supplied from the bias circuit 120 by following the alternating voltage waveform of RF signal, which is the average base current of the transistor 110, increases. When the average base current increases, voltage drop across the resistance element R1 excessively increases, and consequently, the base voltage of the transistor 110 falls more than is needed. As such, in a range in which the output power of RF signal is relatively high, a base-emitter voltage Vbe of the transistor 110 decreases and power gain accordingly decreases, and as a result, linearity may deteriorate.

To address this problem, the power amplifier circuit 100 according to the present embodiment includes the feedback circuit 130. Hereinafter, a specific configuration and operations of the feedback circuit 130 are described.

The feedback circuit 130 subjects the control current Icont to positive feedback in accordance with changes of the average value of the bias current Ibias1 supplied to the base of the transistor 110, such that the base voltage of the transistor 123 is caused to follow the changes in the bias current Ibias1. Specifically, the feedback circuit 130 includes a detection circuit 140, a current mirror circuit 150, an offset circuit 160, and a filter circuit 170.

The detection circuit 140 detects changes of the average value of the bias current Ibias1 flowing into the base of the transistor 110 and outputs a current Ia that changes along with the changes of the average value of the bias current Ibias1. The detection circuit 140 includes a transistor 141 and a resistance element R2.

The transistor 141 (a replica transistor) is configured by using, for example, an HBT. As for the transistor 141, the battery voltage Vbatt is supplied to the collector through a transistor 151 described below; the base is coupled to the emitter of the transistor 123 via the resistance element R2 and the inductor L2; and the emitter is grounded.

As for the resistance element R2, one end is coupled to the emitter of the transistor 123 via the inductor L2 and the other end is coupled to the base of the transistor 141. This means that the resistance element R2 is a ballast resistor coupled in series with the base of the transistor 141.

A bias current Ibias2 (a first current), which is proportional to the bias current Ibias1 supplied to the base of the transistor 110, is supplied to the base of the transistor 141. As a result, the current Ia (a second current), which is determined by multiplying the bias current Ibias2 by hfe, flows in the collector of the transistor 141. This means that the transistor 141 mimics the amplification behavior of the transistor 110 and outputs the current Ia obtained by copying the bias current Ibias1 of the transistor 110. The transistor 141 may be identical to or different from the transistor 110 with respect to size.

For example, the transistor 110, the capacitor C1, the resistance element R1, the transistor 141, and the resistance element R2 may be formed as a single cell 200 (indicated by the dashed line in FIG. 1). While FIG. 1 illustrates one cell 200, the power amplifier circuit 100 may include a plurality of cells having the same configuration as that of the cell 200.

The current mirror circuit 150 generates a current Ib (a third current) proportional to the current Ia outputted from the detection circuit 140 and supplies the current Ib to the control path X1. In the present embodiment, the current mirror circuit 150 includes a pair of transistors 151 and 152. The transistors 151 and 152 in pair are configured by using, for example, P-channel metal-oxide-semiconductor field-effect transistors (MOSFETs).

As for the transistor 151 (a first transistor), the battery voltage Vbatt is supplied to the source; the gate is coupled to the drain; and the drain is coupled to the collector of the transistor 141 of the detection circuit 140. A current equal in amount to the current Ia flowing into the collector of the transistor 141 flows between the source and drain of the transistor 151.

As for the transistor 152 (a second transistor), the battery voltage Vbatt is supplied to the source; the gate is coupled to the gate of the transistor 151; and the drain is coupled to the control path X1. The current Ib proportional to a current flowing between the source and drain of the transistor 151 flows between the source and drain of the transistor 152.

The transistor 152 is smaller in size than the transistor 151. This means that the current Ib flowing in the transistor 152 is less than the current Ia flowing in the transistor 151. The proportion of the transistor 152 and the transistor 151 in size is not particularly specified; for example, when the gain of the transistor 141 is hfe, the current Ib flowing in the transistor 152 can be substantially a current obtained by dividing the current Ia flowing in the transistor 151 by hfe. In this case, the current Ib flowing in the transistor 152 is almost equal in amount to the bias current Ibias2 supplied to the base of the transistor 141.

With the configuration described above, the current mirror circuit 150 supplies the current Ib proportional to the bias current Ibias1 of the transistor 110 to the control path X1 to add the current Ib to the reference current Iref.

The offset circuit 160 ejects a predetermined current Ic (a fourth current) from the current Ib added to the control path X1 by the current mirror circuit 150. Specifically, the offset circuit 160 includes, for example, a current source 161. One end of the current source 161 is coupled to the control path X1 and the other end is grounded. For example, when the RF signal RFin is not supplied to the transistor 110 and the reference current Iref is supplied to the input terminal T1 of the bias circuit 120, the current Ic supplied by the current source 161 may be substantially equal in amount to the current Ib outputted by the current mirror circuit 150. Since the current Ic is ejected from the current Ib, the current added to the control path X1 without necessarily being affected by an alternating current component of RF signal is thus canceled out; as a result, it is possible to avoid excessive current supply to the control path X1.

The filter circuit 170 is provided between the control terminal T2 and the input terminal T1 of the bias circuit 120. The filter circuit 170 has the frequency characteristic of attenuating at least a signal of a frequency component (for example, approximately several hundreds of MHz to several tens of GHz) of a fundamental wave of RF signal and a signal of a frequency component (for example, approximately several MHz to several tens of MHz) of a modulated wave of RF signal.

Specifically, the filter circuit 170 may be, for example, a low-pass filter circuit that attenuates at least a signal of a frequency equal to or greater than the frequency of a modulated wave. The filter circuit 170 in the present embodiment is an L-type low-pass filter circuit including a resistance element R3 coupled in series with the control path X1 and a capacitor C3 having one end coupled to the control path X1 and the other end grounded. The configuration of the low-pass filter circuit is not limited to this example and may be, for example, T-type or a combination of T-type and L-type filter circuits.

Since the RF signal RFin is transmitted to the base of the transistor 110, an RF signal may be inputted to the base of the transistor 141 through the resistance elements R1 and R2. As such, the alternating current component included in the bias current Ibias2 is also included in the current Ib supplied to the control path X1 by the current mirror circuit 150. The filter circuit 170 has a function of attenuating the alternating current component included in the current Ib before the alternating current component is supplied to the bias circuit 120.

With the configuration described above, in the power amplifier circuit 100 according to the present embodiment, when the average value of the bias current Ibias1 of the transistor 110 increases along with increase in the power of the RF signal RFin, the detection circuit 140 detects the increase in the bias current Ibias1 and outputs the current Ia proportional to the bias current Ibias1. The current mirror circuit 150 adds the current Ib proportional to and less than the current Ia to the reference current Iref. In addition, the offset circuit 160 ejects the current Ic from the reference current Iref. Accordingly, the control current Icont supplied to the input terminal T1 of the bias circuit 120 is given by: Icont=Iref+Ib−Ic.

As the control current Icont increases, the current flowing between the collector and the emitter of the transistor 121 increases, and thus, the collector voltage of the transistor 121 rises. Accordingly, the base voltage of the transistor 123 rises; the emitter voltage in turn rises; and the bias voltage Vb of the transistor 110 increases. As a result, decrease in the base voltage of the transistor 110 due to increase in the output power of RF signal is suppressed and linearity is thus improved.

FIGS. 2 to 5 are graphs illustrating simulation results of various values obtained in the power amplifier circuit 100 in FIG. 1 and a power amplifier circuit according to the comparative example. In these graphs, solid lines indicate results of the power amplifier circuit 100 and dashed lines indicate results of the power amplifier circuit according to the comparative example. The comparative example has a configuration formed by excluding the feedback circuit 130 from the power amplifier circuit 100 illustrated in FIG. 1.

Figure 2:
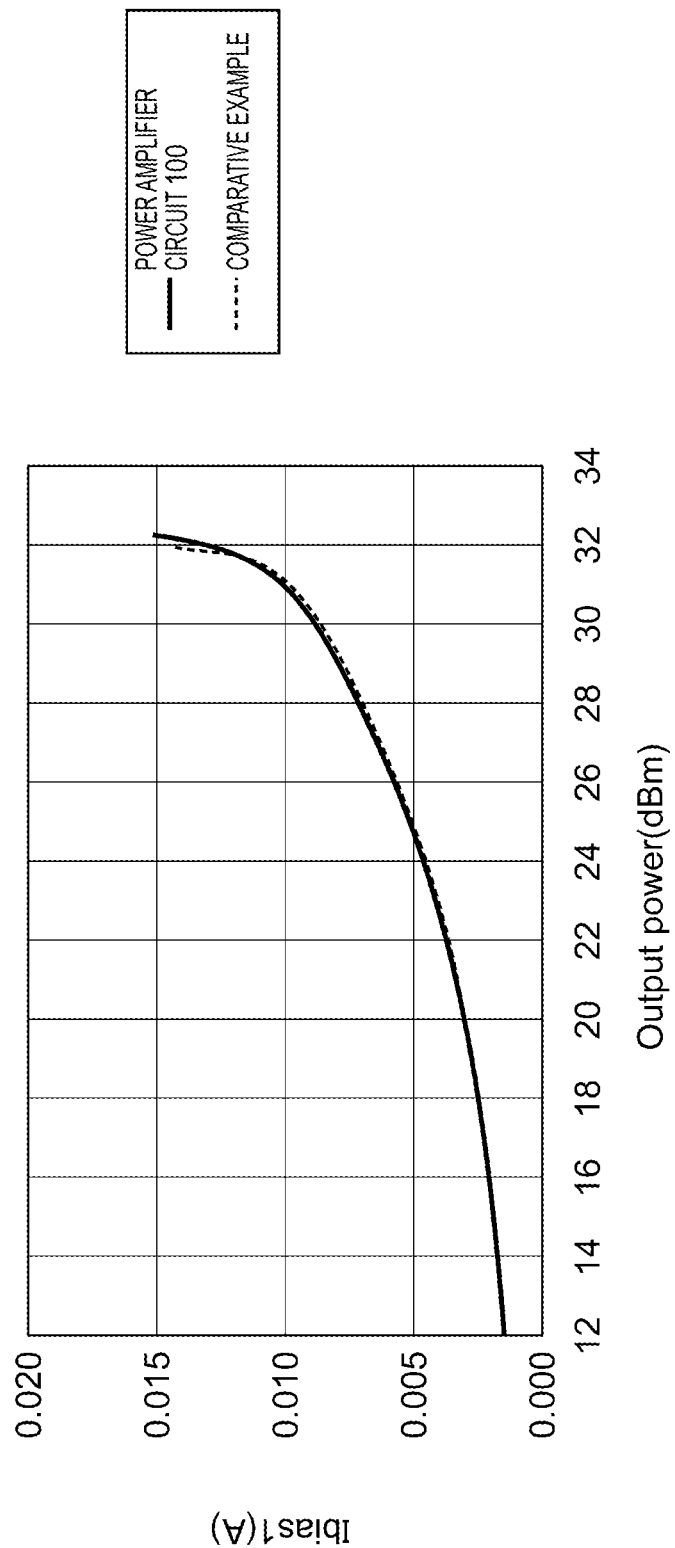
FIG. 2 is a graph illustrating a relationship between output power of RF signal and bias current with respect to the power amplifier circuit according to the first embodiment of the present disclosure and a power amplifier circuit according to a comparative example.

FIG. 2 is a graph illustrating a relationship between the output power of RF signal and the bias current Ibias1 of the transistor 110. In the graph presented in the drawing, the vertical axis indicates the bias current Ibias1 (A) of the transistor 110 and the horizontal axis indicates the output power (dBm) of RF signal.

As illustrated in the graph, as the output power of RF signal increases, the bias current Ibias1 of the transistor 110 increases. Voltage drop across the ballast resistor is proportional to the bias current flowing in the ballast resistor. Hence, voltage drop across the ballast resistor also increases along with the increase in the output power.

Figure 3:
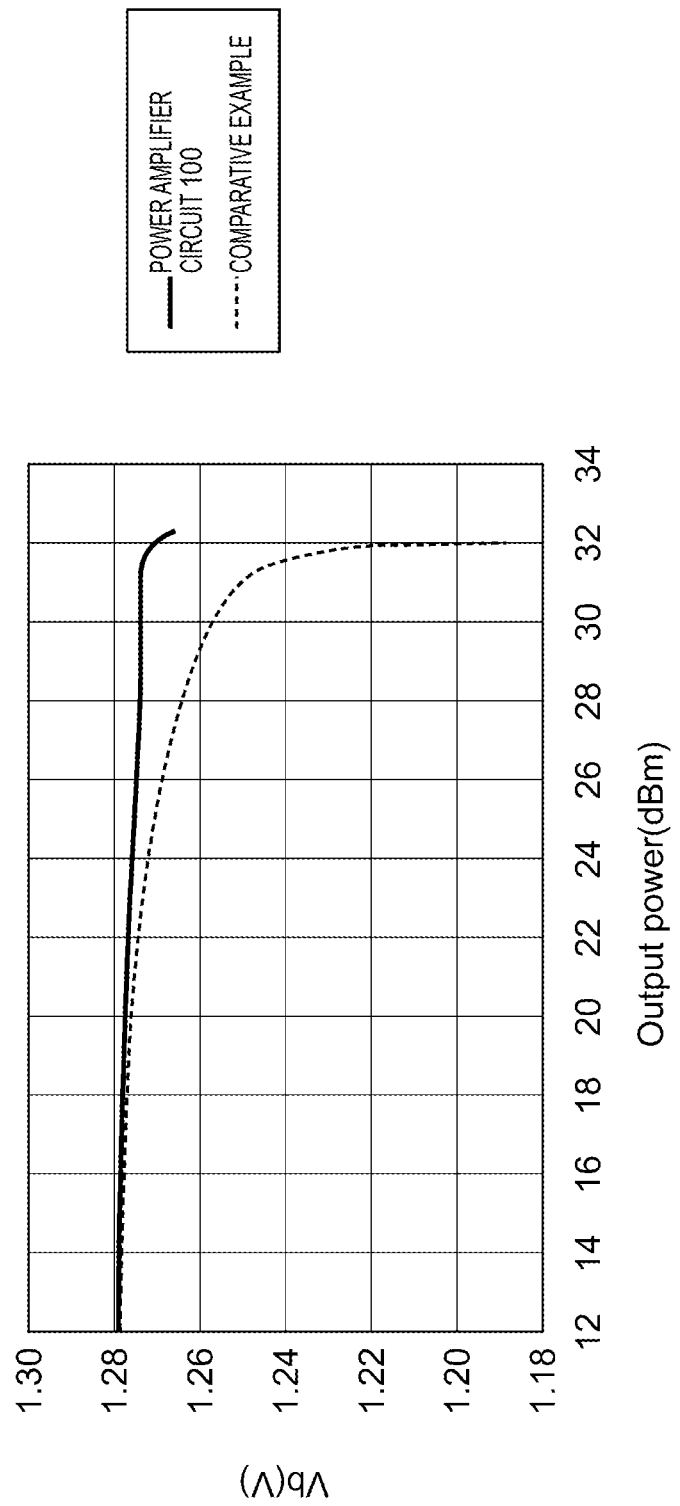
FIG. 3 is a graph illustrating a relationship between output power of RF signal and bias voltage with respect to the power amplifier circuit according to the first embodiment of the present disclosure and the power amplifier circuit according to the comparative example.
Figure 4:
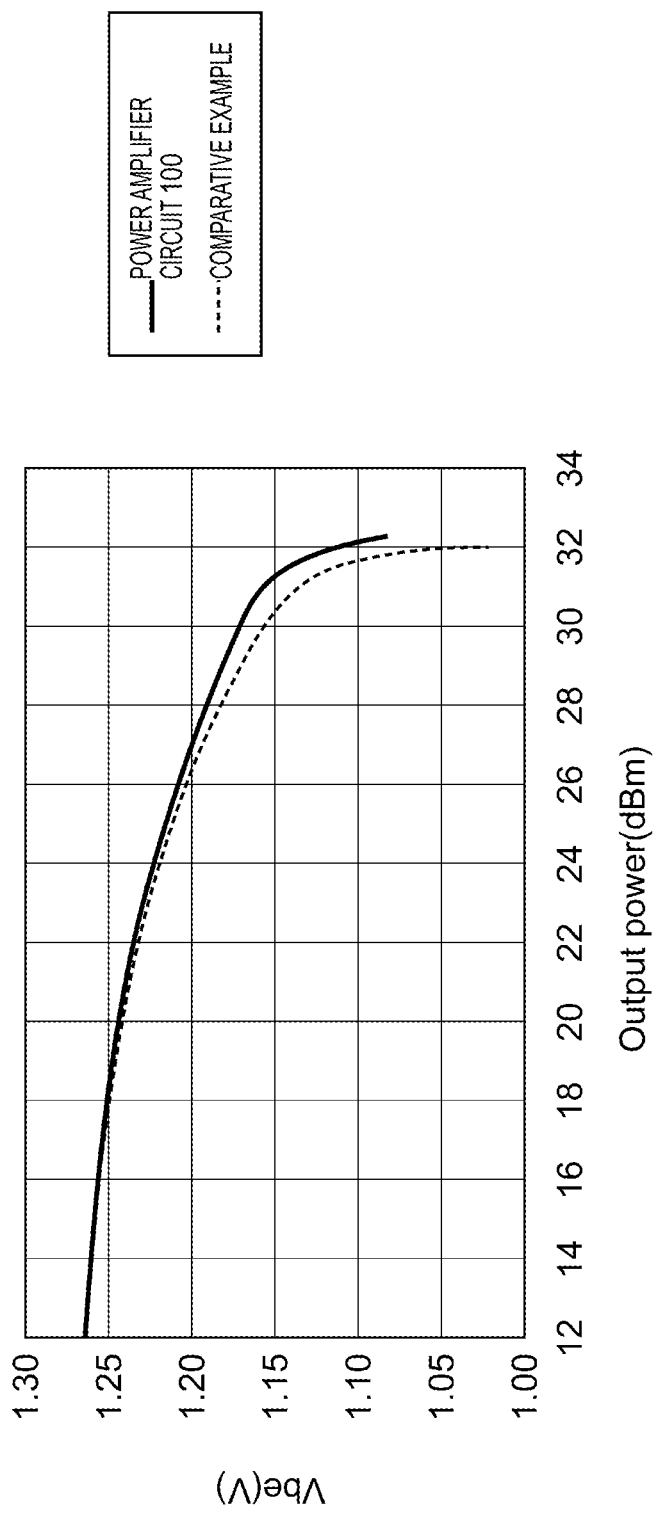
FIG. 4 is a graph illustrating a relationship between output power of RF signal and base-emitter voltage of transistor with respect to the power amplifier circuit according to the first embodiment of the present disclosure and the power amplifier circuit according to the comparative example.

FIG. 3 is a graph illustrating a relationship between the output power of RF signal and the bias voltage Vb of the transistor 110. In the graph presented in the drawing, the vertical axis indicates the bias voltage Vb (V) of the transistor 110 and the horizontal axis indicates the output power (dBm) of RF signal. FIG. 4 is a graph illustrating a relationship between the output power of RF signal and the base-emitter voltage Vbe of the transistor 110. In the graph presented in the drawing, the vertical axis indicates the base-emitter voltage Vbe (V) of the transistor 110 and the horizontal axis indicates the output power (dBm) of RF signal.

In FIG. 3, as for the comparative example (dashed line), the bias voltage Vb of the transistor 110 decreases along with increase in the output power. In addition to this, voltage drop across the ballast resistor also increases along with the increase in output power. As a result, as illustrated in FIG. 4, the base-emitter voltage Vbe of the transistor 110 significantly decreases along with increase in the output power.

By contrast, as for the power amplifier circuit 100 (solid line) according to the present embodiment, while the output power increases, decrease in the bias voltage Vb of the transistor 110 is suppressed and the bias voltage Vb is maintained at a substantially fixed level as illustrated in FIG. 3. As a result, as illustrated in FIG. 4, it is understood that, although the voltage decreases by voltage drop across the ballast resistor, decrease in the base-emitter voltage Vbe of the transistor 110 is still suppressed in comparison to the comparative example.

Figure 5:
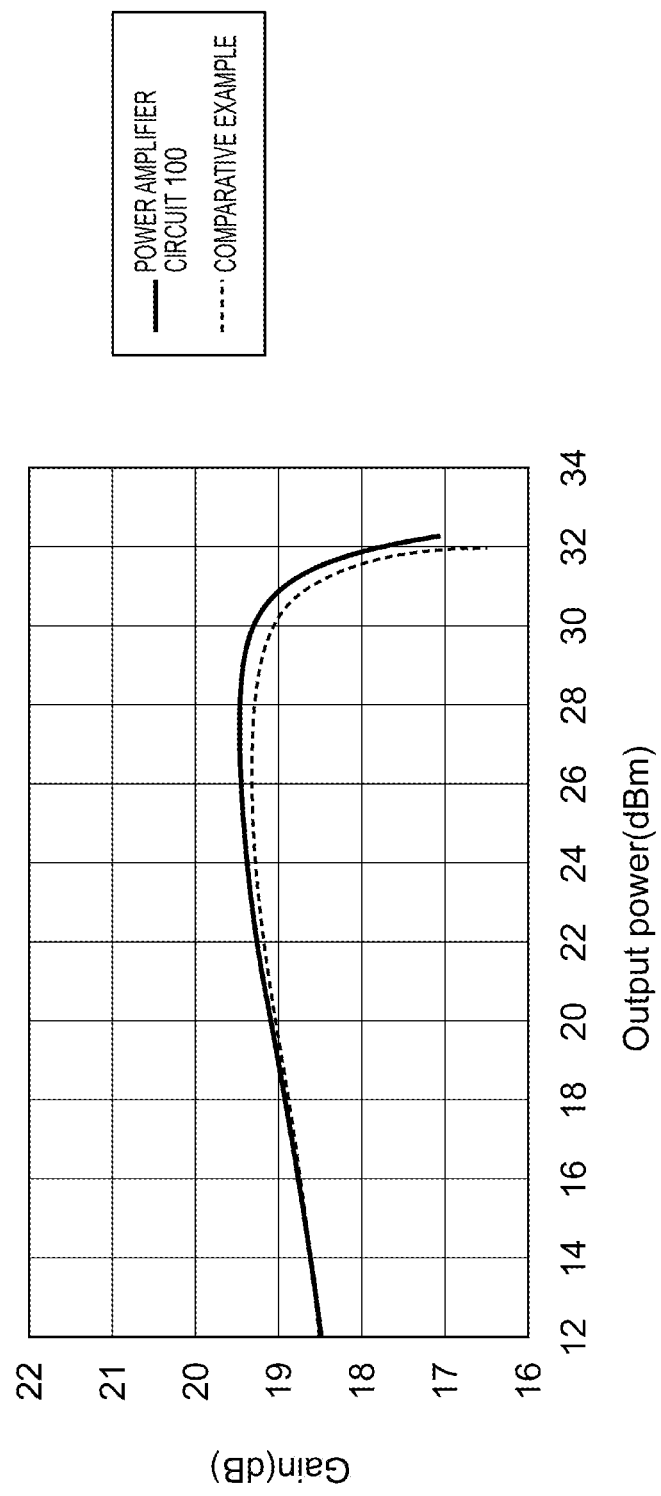
FIG. 5 is a graph illustrating a relationship between output power of RF signal and power gain with respect to the power amplifier circuit according to the first embodiment of the present disclosure and the power amplifier circuit according to the comparative example.

FIG. 5 is a graph illustrating a relationship between the output power of RF signal and the power gain of the transistor 110. In the graph presented in the drawing, the vertical axis indicates the power gain (dB) of the transistor 110 and the horizontal axis indicates the output power (dBm) of RF signal.

As illustrated in FIG. 5, as for the power amplifier circuit 100 (solid line) according to the present embodiment, since decrease in the base-emitter voltage of the transistor 110 is suppressed as described above, the power gain starts falling at a higher level of output power in comparison to the comparative example (dashed line). According to this graph, it is understood that linearity of the power amplifier circuit 100 is improved as compared to the comparative example.

The power amplifier circuit 100 according to the present embodiment includes HBTs and MOSFETs and may be fabricated by employing, for example, a bipolar field-effect transistor (BiFET) or bipolar complementary metal-oxide-semiconductor (BiCMOS) process. BiFET is a manufacturing process of forming a bipolar transistor and a FET together as a single chip. BiCMOS is a manufacturing process of forming a bipolar transistor and a CMOS together as a single chip.

Concerning the power amplifier circuit 100 according to the present embodiment, while the example in which the reference current Iref, which is a constant current, is supplied to the control terminal T2 is presented, a reference voltage that is a constant voltage may be supplied to the control terminal T2. In this case, an element such as a resistance element may be provided between the control terminal T2 and the input terminal T1 and a current corresponding to the reference voltage may be supplied to the collector of the transistor 121.

Concerning the power amplifier circuit 100 according to the present embodiment, the configuration in which the power of RF signal is amplified in one stage is presented. This configuration may be applied to a power amplifier circuit in which electric power is amplified in two or more stages. In the case in which this configuration is applied to a power amplifier circuit configured to amplify electric power in multiple stages, this configuration may be used as, for example, an amplifier in the last stage. Because the power of RF signal in the last stage is relatively high in comparison to amplifiers of other stages, providing the feedback circuit 130 in the last stage is highly effective. In this case, the amplifiers of other stages may not necessarily include the feedback circuit 130.

Figure 6:
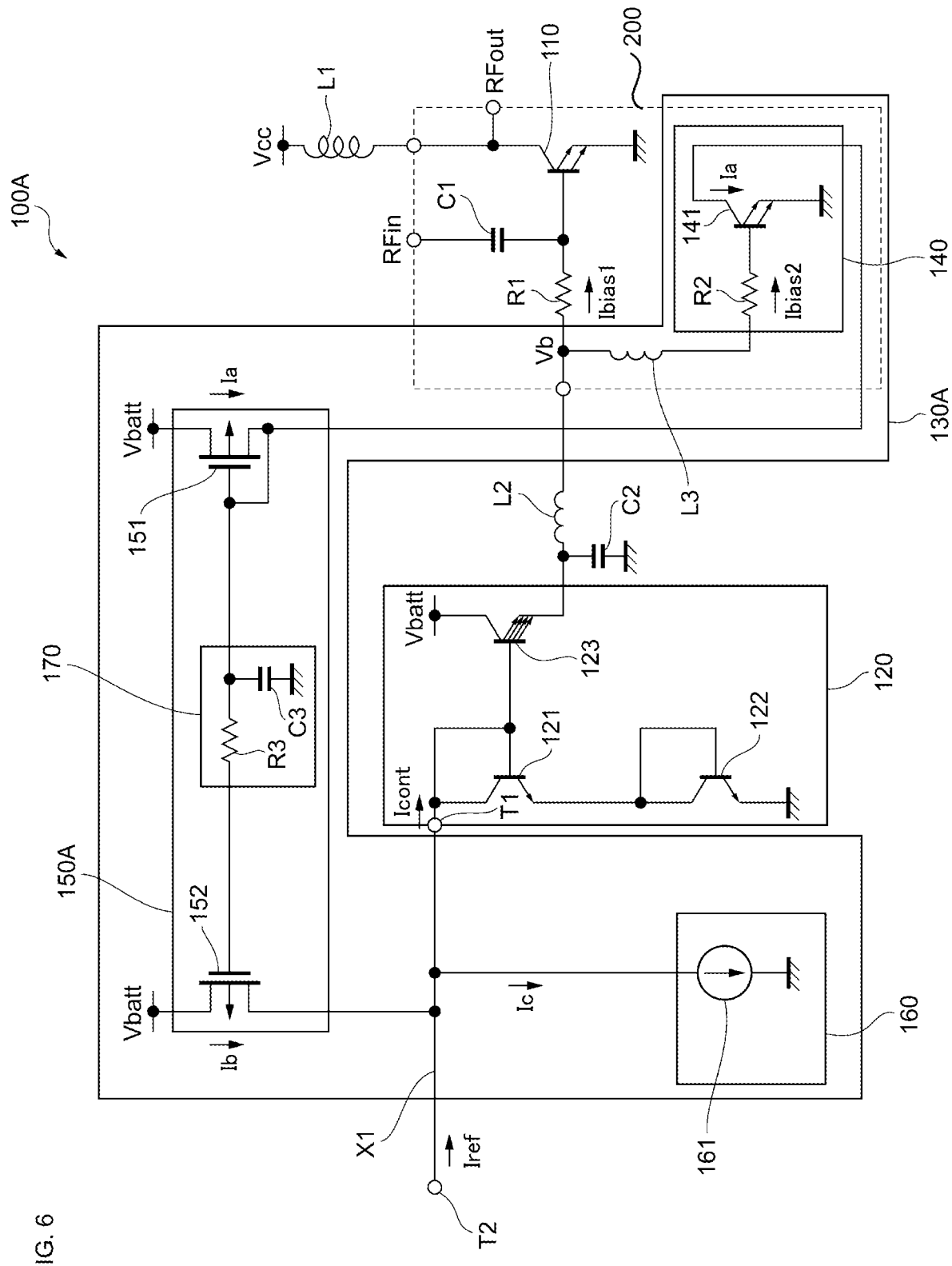
FIG. 6 illustrates an example of a configuration of a power amplifier circuit according to a second embodiment of the present disclosure.

FIG. 6 illustrates an example of a configuration of a power amplifier circuit according to a second embodiment of the present disclosure. In the second and subsequent embodiments, descriptions about specifics common to the first embodiment are not repeated and only different points are explained. In particular, almost identical effects and advantages achieved by almost identical configurations are not mentioned in every embodiment.

As illustrated in FIG. 6, a power amplifier circuit 100A according to the second embodiment includes a feedback circuit 130A instead of the feedback circuit 130 as compared to the power amplifier circuit 100 according to the first embodiment described above. As compared to the feedback circuit 130, the feedback circuit 130A further includes an inductor L3 and also includes a current mirror circuit 150A instead of the current mirror circuit 150.

The inductor L3 is coupled in series between the emitter of the transistor 123 of the bias circuit 120 and the base of the transistor 141 of the detection circuit 140. This means that the inductor L3 is coupled in series with the resistance element R2. The inductor L3 suppresses transmission of the RF signal RFin, which is supplied to the transistor 110, to the base of the transistor 141 through the resistance element R1.

In the feedback circuit 130A, the filter circuit 170 is provided not on the control path X1 but between the gate of the transistor 151 and the gate of the transistor 152 in the current mirror circuit 150A. As such, the position at which the filter circuit 170 is provided is not limited to a position on the control path X1, but the filter circuit 170 may be provided at any point on a path starting from an output terminal, which is the collector, of the transistor 141 and leading to the base of the transistor 123 of the bias circuit 120 via the current mirror circuit 150A and the control path X1. In the present embodiment, as compared to the first embodiment described above, it is possible to decrease the capacitance value of the capacitor C3 included in the filter circuit 170.

Figure 7:
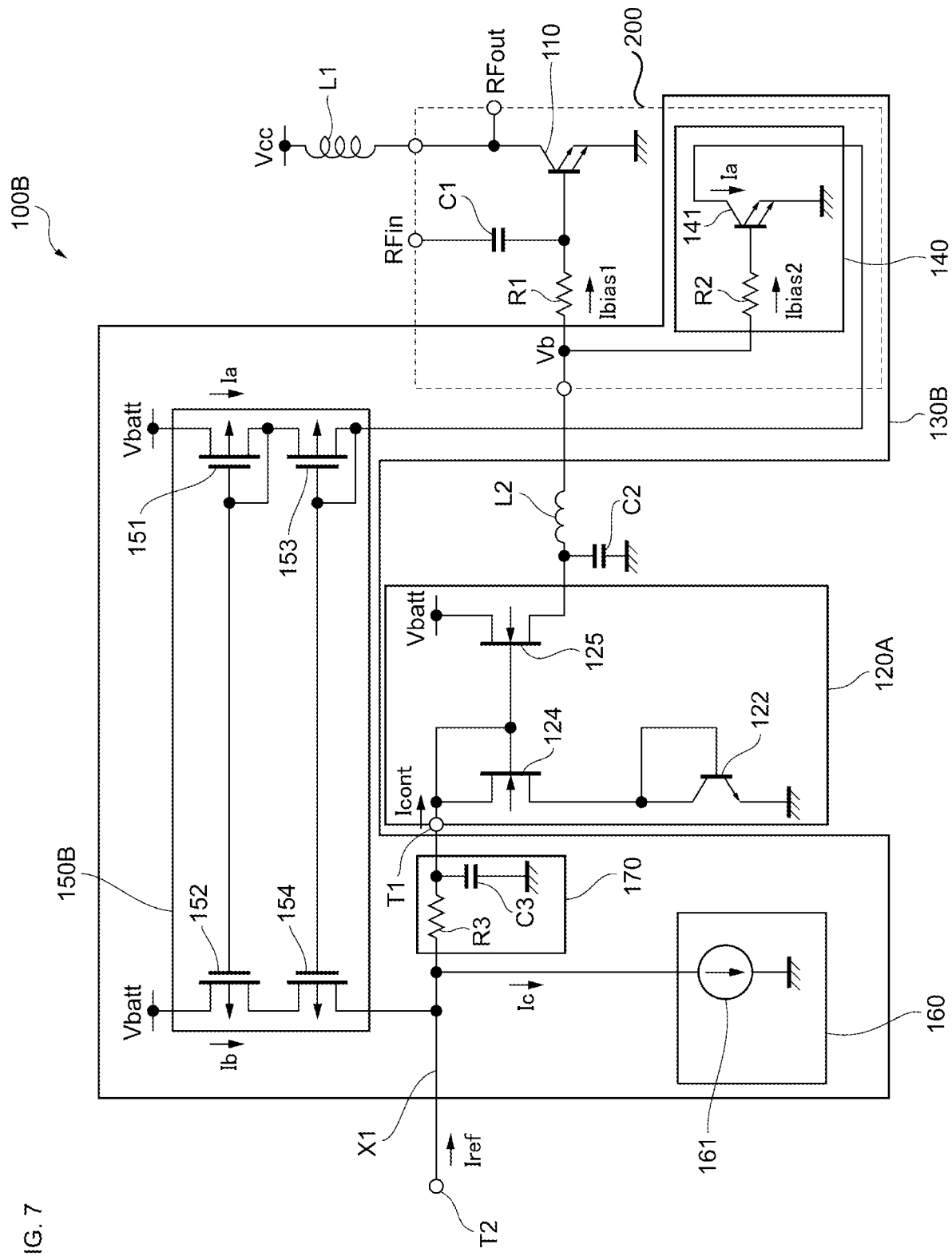
FIG. 7 illustrates an example of a configuration of a power amplifier circuit according to a third embodiment of the present disclosure.

FIG. 7 illustrates an example of a configuration of a power amplifier circuit according to a third embodiment of the present disclosure. As illustrated in FIG. 7, a power amplifier circuit 100B according to the third embodiment includes a bias circuit 120A instead of the bias circuit 120 and also includes a feedback circuit 130B instead of the feedback circuit 130 as compared to the power amplifier circuit 100 according to the first embodiment described above.

As compared to the bias circuit 120, the bias circuit 120A includes transistors 124 and 125 instead of the transistors 121 and 123. The transistors 124 and 125 are configured by using, for example, N-channel MOSFETs.

As for the transistor 124, the drain and the gate are coupled to each other and the source is coupled to the collector of the transistor 122. As for the transistor 125, the battery voltage Vbatt is supplied to the drain; the gate is coupled to the drain of the transistor 124; the source is coupled to the base of the transistor 110 via the inductor L2 and the resistance element R1 and also coupled to the base of the transistor 141 via the inductor L2 and the resistance element R2. With this configuration, the bias currents Ibias1 and Ibias2 corresponding to the control current Icont are supplied from the source of the transistor 125 respectively to the base of the transistor 110 and the base of the transistor 141.

MOSFET can operate at a lower threshold voltage as compared to HBT. Hence, the bias circuit 120A can operate at lower voltage as compared to the bias circuit 120, and thus, power consumption of the battery can be reduced. The bias circuit 120A may be fabricated by employing a BiFET process, or the transistor 122 may also be configured by using a MOSFET.

As compared to the feedback circuit 130, the feedback circuit 130B includes a current mirror circuit 150B instead of the current mirror circuit 150. As compared to the current mirror circuit 150, the current mirror circuit 150B further includes the transistors 153 and 154. The transistors 153 and 154 are configured by using, for example, P-channel MOSFETs.

As for the transistor 153 (a third transistor), the source is coupled to the drain of the transistor 151; the gate is coupled to the drain; and the drain is coupled to the collector of the transistor 141. As for the transistor 154 (a fourth transistor), the source is coupled to the drain of the transistor 152; the gate is coupled to the gate of the transistor 153; and the drain is coupled to the control path X1. This means that the transistors 153 and 154 are cascoded (i.e. cascode-connected) respectively with the transistors 151 and 152.

In the current mirror circuit 150B, since the transistors 151 and 152 are cascoded respectively with the transistors 153 and 154, the difference in current due to the difference in source-drain voltage between the transistors 151 and 152 is reduced. Specifically, in the current mirror circuit 150B, since the battery voltage Vbatt is supplied to both the source of the transistor 151 and the source of the transistor 152, the source voltage of the transistor 151 and the source voltage of the transistor 152 are equal to each other. In addition, the drain voltage of the transistor 151 and the drain voltage of the transistor 152 are constant due to the gate-source voltage of the transistor 153 of a lower stage and the gate-source voltage of the transistor 154 of a lower stage. Thus, the source-drain voltage of the transistor 151 and the source-drain voltage of the transistor 152 are equal to each other, and as a result, the current flowing in the transistor 151 is mirrored in the transistor 152 with improved precision.

As described above, the current mirror circuit 150B may be configured by cascoding. The transistors 151 to 154 included in the current mirror circuit 150B and the transistors 124 and 125 included in the bias circuit 120A may be formed by employing the same process.

Figure 8:
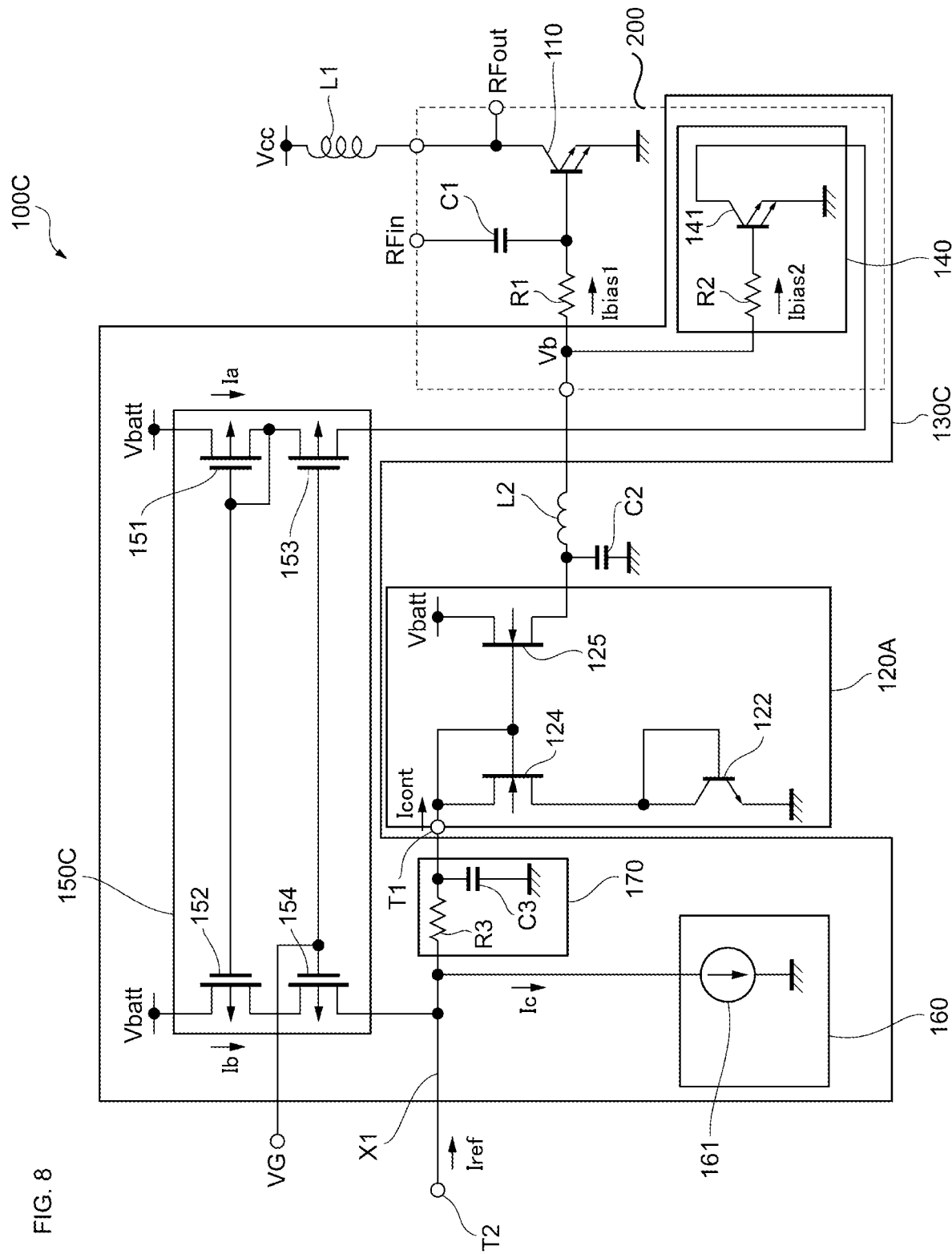
FIG. 8 illustrates an example of a configuration of a power amplifier circuit according to a fourth embodiment of the present disclosure.

FIG. 8 illustrates an example of a configuration of a power amplifier circuit according to a fourth embodiment of the present disclosure. As illustrated in FIG. 8, a power amplifier circuit 100C according to the fourth embodiment includes a feedback circuit 130C instead of the feedback circuit 130B as compared to the power amplifier circuit 100B according to the third embodiment described above.

As compared to the feedback circuit 130B, the feedback circuit 130C includes a current mirror circuit 150C instead of the current mirror circuit 150B. The current mirror circuit 150C differs from the current mirror circuit 150B in the connection configuration of the transistors 153 and 154.

As for the transistor 153 (the third transistor), the source is coupled to the drain of the transistor 151; the gate is coupled to the gate of the transistor 154 and a control voltage VG is supplied to the gate of the transistor 153; and the drain is coupled to the collector of the transistor 141. As for the transistor 154 (the fourth transistor), the source is coupled to the drain of the transistor 152; the gate is coupled to the gate of the transistor 153 and the control voltage VG is supplied to the gate of the transistor 154; and the drain is coupled to the control path X1. Also with this configuration, the current mirror circuit 150C can achieve the same effect as that of the current mirror circuit 150B.

In the case in which the filter circuit 170 is provided in the current mirror circuit 150B or 150C similarly to the power amplifier circuit 100A illustrated in FIG. 6, the filter circuit 170 may be provided between the gate of the transistor 151 and the gate of the transistor 152 or between the gate of the transistor 153 and the gate of the transistor 154.

Figure 9:
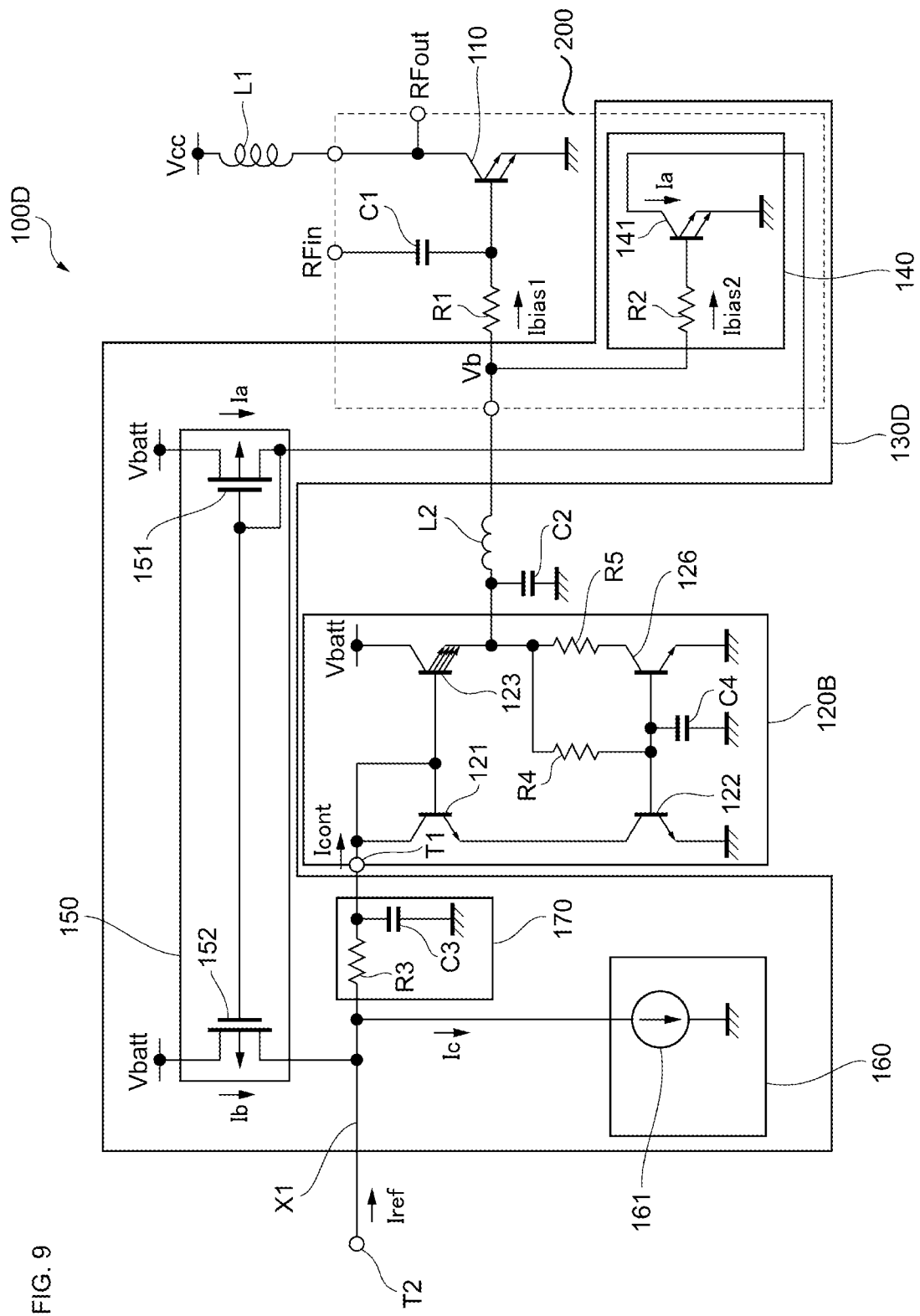
FIG. 9 illustrates an example of a configuration of a power amplifier circuit according to a fifth embodiment of the present disclosure.

FIG. 9 illustrates an example of a configuration of a power amplifier circuit according to a fifth embodiment of the present disclosure. As illustrated in FIG. 9, a power amplifier circuit 100D according to the fifth embodiment includes a bias circuit 120B instead of the bias circuit 120 as compared to the power amplifier circuit 100 according to the first embodiment described above. As compared to the bias circuit 120, the bias circuit 120B further includes a transistor 126, resistance elements R4 and R5, and a capacitor C4.

The transistor 126 is configured by using, for example, an HBT. As for the transistor 126, the collector is coupled to the emitter of the transistor 123 via the resistance element R5; the base is coupled to the base of the transistor 122; and the emitter is grounded.

The resistance element R4 is coupled in series between the collector and the base of the transistor 126. The resistance element R5 is coupled in series between the emitter of the transistor 123 and the collector of the transistor 126. As for the capacitor C4, one end is coupled to the base of the transistor 126 and the other end is grounded. An effect of the bias circuit 120B is described below.

As the output power of the transistor 110 increases, the bias current Ibias1 supplied from the emitter of the transistor 123 to the base of the transistor 110 increases, as a result, the voltage at the emitter of the transistor 123 is led to rise. At this time, the base voltage of the transistor 126 also increases with the function of the resistance element R4 and the transistor 126 is accordingly activated. As a result, current flows in the transistor 126 and excessive increase in the emitter voltage of the transistor 123 is avoided.

The resistance element R4 and the capacitor C4 function as a low-pass filter circuit having the frequency characteristic of attenuating the frequency component of the fundamental wave of the RF signal RFin inputted to the transistor 110 and passing the frequency component of the modulated wave. Specifically, when the frequency component of the fundamental wave of the RF signal RFin is transmitted to the collector of the transistor 126, the resistance element R4 and the capacitor C4 function as a filter circuit that attenuates the radio frequency component, and thus, changes in the base voltage of the transistor 126 is prevented. Accordingly, the bias circuit 120B can supply a stable bias signal to the transistor 110.

Furthermore, when the emitter voltage of the transistor 123 is led to rise, the base voltage of the transistor 122 also rises with the function of the resistance element R4. Thus, increased current flows in the transistor 122 and the voltage at the collector of the transistor 121 decreases. Accordingly, the base voltage of the transistor 123 coupled to the collector of the transistor 121 falls and the current flowing in the transistor 123 decreases. Also by such negative feedback, excessive increase in the emitter voltage of the transistor 123 is avoided.

As described above, the power amplifier circuit 100D according to the present embodiment can stably supply the bias voltage Vb of the transistor 110 due to negative feedback that suppresses excessive increase in the emitter voltage of the transistor 123.

The bias circuit 120B may not necessarily include the resistance element R5. Moreover, for example, similarly to the bias circuit 120A illustrated in FIG. 7, the bias circuit 120B may include the transistors 124 and 125 configured by using MOSFETs.

The exemplary embodiments of the present disclosure have been described above. The power amplifier circuits 100, and 100A to 100D include the amplifier transistor configured to amplify an input signal, the resistance element coupled in series with the base of the amplifier transistor, the bias transistor configured to supply a bias current from the emitter or the source of the bias transistor to the base of the amplifier transistor through the resistance element, and the feedback circuit configured to change a base or gate voltage of the bias transistor to follow a change in the bias current supplied to the base of the amplifier transistor. When the output power of the input signal increases and the average bias current of the amplifier transistor increases, the base or gate voltage of the bias transistor rises, and as a result, the bias voltage supplied to the base of the amplifier transistor rises. Accordingly, it is possible to hinder linearity deterioration due to increase in output power of input signal.

In the power amplifier circuits 100, and 100A to 100D, the feedback circuit includes the control path to which a reference current or a reference voltage is supplied, the replica transistor configured to amplify the first current proportional to the bias current and output the second current from an output terminal of the replica transistor, the current mirror circuit configured to generate the third current proportional to and less than the second current and supply the third current to the control path, and the filter circuit provided on a path starting from the output terminal of the replica transistor and leading to the base or the gate of the bias transistor via the current mirror circuit and the control path and configured to attenuate a signal of the frequency component of the fundamental wave of the input signal and a signal of the frequency component of the modulated wave of the input signal. The base or gate voltage of the bias transistor is controlled in accordance with the current flowing in the control path. With this configuration, the reference current or the reference voltage, and the third current proportional to the bias current of the amplifier transistor are supplied to the control path, and as a result, it is possible to control the base or gate voltage of the bias transistor to follow the bias current of the amplifier transistor. Furthermore, since the power amplifier circuits 100, and 100A to 100D include the filter circuit, it is possible to attenuate the radio frequency component included in the third current outputted by the current mirror circuit.

In the power amplifier circuits 100, and 100A to 100D, the feedback circuit further includes the offset circuit configured to eject the predetermined fourth current from the control path. The predetermined fourth current ejected by the offset circuit is substantially equal in amount to the third current that is supplied from the current mirror circuit to the control path in the state in which the input signal is not transmitted to the amplifier transistor. With this configuration, the current added to the control path without necessarily being affected by the alternating current component of input signal is thus canceled out; as a result, it is possible to avoid excessive current supply to the control path.

In the power amplifier circuit 100A, the current mirror circuit includes the first transistor and the second transistor coupled to each other at their base or gate. The filter circuit is provided between the base or the gate of the first transistor and the base or the gate of the second transistor. With this configuration, it is possible to decrease the capacitance value of the capacitor included in the filter circuit.

In the power amplifier circuits 100B and 100C, the current mirror circuit further includes the first transistor and the second transistor coupled to each other at their base or gate and the third transistor and the fourth transistor cascoded respectively with the first transistor and the second transistor. With this configuration, the source-drain voltage of the first transistor and the source-drain voltage of the second transistor are equal to each other, and as a result, the current flowing in the first transistor is mirrored in the second transistor with improved precision.

The embodiments described above have been made for ease of understanding the present disclosure and should not be construed to limit the present disclosure. The present disclosure can be changed or improved without necessarily departing from its spirit and also includes equivalents thereof. This means that modifications to the embodiments designed by those skilled in the art as appropriate are also embodied in the scope of the present disclosure when the modifications have features of the present disclosure. For example, the elements included in the embodiments, the arrangements thereof, materials, conditions, shapes, sizes are not limited to the examples and may be changed as appropriate. Furthermore, the elements included in the embodiments can be combined with each other when technically possible and combinations thereof may be encompassed in the scope of the present disclosure when the combinations have features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A power amplifier circuit comprising:
 an amplifier transistor configured to amplify an input signal;
 a resistance element connected in series with a base of the amplifier transistor;
 a bias transistor configured to supply a bias current from an emitter or a source of the bias transistor to the base of the amplifier transistor through the resistance element; and
 a positive feedback circuit configured to change a base voltage or a gate voltage of the bias transistor based on a change in the bias current, wherein the positive feedback circuit comprises a current mirror circuit connected to the bias transistor and an offset circuit.

2. The power amplifier circuit according to claim 1, wherein the positive feedback circuit comprises:
- a control path to which a reference current or a reference voltage is supplied,
- a replica transistor configured to amplify a first current and to output a second current from an output terminal of the replica transistor, the first current being proportional to the bias current,
- the current mirror circuit configured to generate a third current and to supply the third current to the control path, the third current being proportional to and less than the second current, and
- a filter circuit on a path that connects the output terminal of the replica transistor to a base or a gate of the bias transistor via the current mirror circuit and the control path, the filter circuit being configured to attenuate a frequency component of a fundamental wave of the input signal and a frequency component of a modulated wave of the input signal, and
- wherein the base voltage or the gate voltage of the bias transistor is controlled in accordance with a current flowing in the control path.

3. The power amplifier circuit according to claim 2, wherein the offset circuit is configured to eject a predetermined fourth current from the control path.

4. The power amplifier circuit according to claim 3, wherein the predetermined fourth current is substantially equal to the third current when the input signal is not transmitted to the amplifier transistor.

5. The power amplifier circuit according to claim 2, wherein:
- the current mirror circuit comprises a first transistor and a second transistor, a base or a gate of the first transistor being connected to a base or a gate of the second transistor, and
- the filter circuit is between the base or the gate of the first transistor and the base or the gate of the second transistor.

6. The power amplifier circuit according to claim 3, wherein:
- the current mirror circuit comprises a first transistor and a second transistor, a base or a gate of the first transistor being connected to a base or a gate of the second transistor, and
- the filter circuit is between the base or the gate of the first transistor and the base or the gate of the second transistor.

7. The power amplifier circuit according to claim 4, wherein:
- the current mirror circuit comprises a first transistor and a second transistor, a base or a gate of the first transistor being connected to a base or a gate of the second transistor, and
- the filter circuit is between the base or the gate of the first transistor and the base or the gate of the second transistor.

8. The power amplifier circuit according to claim 2, wherein the current mirror circuit further comprises:
- a first transistor and a second transistor, a base or a gate of the first transistor being connected to a base or a gate of the second transistor, and
- a third transistor cascode-connected with the first transistor, and a fourth transistor cascode-connected with the second transistor.

9. The power amplifier circuit according to claim 3, wherein the current mirror circuit further comprises:
- a first transistor and a second transistor, a base or a gate of the first transistor being connected to a base or a gate of the second transistor, and
- a third transistor cascode-connected with the first transistor, and a fourth transistor cascode-connected with the second transistor.

10. The power amplifier circuit according to claim 4, wherein the current mirror circuit further comprises:
- a first transistor and a second transistor, a base or a gate of the first transistor being connected to a base or a gate of the second transistor, and
- a third transistor cascode-connected with the first transistor, and a fourth transistor cascode-connected with the second transistor.

11. A power amplifier circuit comprising:
- an amplifier transistor configured to amplify an input signal;
- a resistance element connected in series with a base of the amplifier transistor;
- a bias transistor configured to supply a bias current from an emitter or a source of the bias transistor to the base of the amplifier transistor through the resistance element; and
- a positive feedback circuit configured to change a base voltage or a gate voltage of the bias transistor based on a change in the bias current,
- wherein the positive feedback circuit is further configured to supply a positive feedback current to a control current based on a change of an average value of the bias current.

* * * * *